(12) United States Patent
Takeda

(10) Patent No.: US 6,469,589 B2
(45) Date of Patent: Oct. 22, 2002

(54) NOISE FILTER WITH AN OUTER WIRE FIXING PORTION ON THE CORE CASE

(75) Inventor: Yasuto Takeda, Yokkaichi (JP)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 0 days.

(21) Appl. No.: 09/725,124

(22) Filed: Nov. 29, 2000

(65) Prior Publication Data

US 2001/0002805 A1 Jun. 7, 2001

(30) Foreign Application Priority Data

Dec. 3, 1999 (JP) ............................................. 11-344550

(51) Int. Cl.⁷ ................................................ H03H 7/01
(52) U.S. Cl. ........................... 333/12; 336/92; 336/176; 333/181
(58) Field of Search ...................... 333/12, 181; 336/90, 336/92, 175, 176

(56) References Cited

U.S. PATENT DOCUMENTS 5,619,174 A * 4/1997 Kimura et al. ............... 333/181
5,920,250 A   7/1999 Watanabe et al. .......... 333/12 X
6,072,125 A * 6/2000 Takeuchi ..................... 333/12 X

FOREIGN PATENT DOCUMENTS

| JP | 01-227371 A | * 9/1989 | ................. 439/620 |
| JP | 10335147 | 12/1998 | |
| JP | 11097875 | 4/1999 | |

* cited by examiner

Primary Examiner—Justin P. Bettendorf
(74) Attorney, Agent, or Firm—Greenblum & Bernstein, P.L.C.

(57) ABSTRACT

A noise filter is provided with a cylindrical ferrite core having a wire insertion through-hole, the ferrite core being received within a case. A wire passing once through the wire insertion through-hole is looped to surround an exterior of the case and passes back through the wire insertion through-hole. A wire fixing portion is provided on the outer surface of the case so as to hold and fix a portion of the wire to the exterior of the case. The wire fixing portion includes a pressing surface and a pressing portion that faces the pressing surface, and the pressing portion is opened from and closed toward the pressing surface. Thus, the noise filter is prevented from displacement or sliding on the wire. Further, a method of mounting the noise filter on the wire is provided.

18 Claims, 8 Drawing Sheets

(PRIOR ART)

NOISE FILTER WITH AN OUTER WIRE FIXING PORTION ON THE CORE CASE

BACKGROUND OF THE INVENTION

1. Field of Invention

This invention relates to a noise filter. In particular, this invention relates to a noise filter that is securely prevented from sliding and displacement from a desired position on wires. This invention further relates to a method for mounting a noise filter on a wire. This invention additionally relates to a combination of a noise filter and a wire.

2. Description of Related Art

FIG. 7 shows a conventional noise filter 1 provided on wires to absorb electromagnetic noise. The noise filter 1 has a case 2, which can be separated into halves, and a cylindrical ferrite core 3 provided inside of the case 2. When this type of noise filter 1 is used, to improve the noise absorbing effect, wires W pass through a wire insertion through-hole 3a provided in the ferrite core 3 and are looped at least once to wind around the outside of the case 2 in an axial (longitudinal) direction of the cylindrical ferrite core 3. In this case, since the wires W are wound around the outside of the case 2, the noise filter 1 is prevented, to some extent, from sliding on the wires W or displacing from a predetermined position. However, conventionally, a tie band 4 is provided to securely fix the noise filter 1 at the predetermined position on an outer periphery of the wires W.

To fix the noise filter 1 to the wires W by using the tie band 4, as described above, a fixing operation is required in which the tie band is inserted into the loop of wires W and the wires that are looped to wind around the outside of the case 2 and pass back through the ferrite core 3 and the wires directly passing into the ferrite core 3 should be fastened together with the tie band 4. However, such a fixing operation using the tie band 4 is troublesome, tends to vary depending on operators, and causes unstable quality of products.

The present invention is provided in view of the above-described problems. An objective of the present invention is to provide a noise filter that can be securely fixed at a predetermined position on the wires and to improve the effectiveness of a mounting operation of the noise filter on the wires.

SUMMARY OF THE INVENTION

To achieve the above and/or other goals, the present invention provides a noise filter that includes a core having a wire insertion through-hole extending in a longitudinal direction of the core, a case that covers the core, and a wire fixing portion provided on an outer surface of the case so as to hold the wires passing through the wire insertion through-hole and looped to wind around the outside of the case. The core absorbs electromagnetic noise.

According to the construction described above, when the noise filter is mounted around the wires and the wires are looped to wind around the outside of a case of the noise filter, the wire fixing portion holds and fixes the wires in position. Accordingly, the noise filter is prevented from being displaced from a predetermined position or from sliding on the wires, and thus, is securely fixed on the wires.

The wire fixing portion can include a pressing surface provided on the outer surface of the case, and a pressing portion that faces the pressing surface and can be opened from and closed toward the pressing surface, the wire being held between the pressing surface and the pressing portion.

A stopper including at least one ridge and at least one trough can be formed on at least one of the pressing surface and a surface of the pressing portion facing the pressing surface. It is also possible to provide a stopper including at least one depression formed in one of the pressing surface and a surface of the pressing portion facing the pressing surface, and at least one projection formed in another one of the pressing surface and the surface of the pressing portion facing the pressing surface.

According to the construction described above, the wires looped to wind around the outside of the case can be sandwiched between the pressing portion and the pressing surface. Further, the wires are more positively fixed to the noise filter by the stopper provided on facing surfaces of the pressing portion and the pressing surface.

Further, the wire fixing portion can include interengaging locking elements respectively provided on the pressing portion and on the case. The interengaging locking elements cooperate to lock the pressing portion to the outer surface of the case to hold the wire in position. The interengaging locking elements may include a locking hook and a locking hole. The interengaging locking elements lock the pressing portion to the outer surface of the case by inserting the locking hook into the locking hole.

The wire fixing portion can further include a hinge connecting an edge of the pressing surface and an edge of the pressing portion along a longitudinal direction of the core. In this case, the interengaging locking elements may be provided at an edge opposite the edge where the hinge is placed.

The wire fixing portion can be formed separately from the case. In this case, a plurality of interengaging locking elements are respectively provided on the wire fixing portion and on the case to retain the wire fixing portion in position to hold the wire.

According to the construction as described above, while the wires are placed between the pressing portion and the pressing surface, the pressing portion is pressed toward the outer surface of the case. Thus, the pressing portion can be locked with the outer surface of the case with a single operation.

Preferably, the case is formed to have a cylindrical shape. The wire fixing portion can be placed on an outer peripheral surface of the case or on an end face of the case.

Preferably, the noise filter is formed into at least two separable portions and at least one of the separable portions has at least a portion of the wire insertion through-hole. Further, it is preferable that the wire fixing portion is provided on one of the separable portions in which the at least portion of the wire insertion through-hole is provided.

In another aspect of the present invention, there is provided a method of mounting a noise filter on a wire, including inserting the wire into a wire insertion through-hole extending in a longitudinal direction of the noise filter and looping the wire so that the wire winds around the noise filter, placing the wire on an exterior of the noise filter on a pressing surface of a wire fixing portion provided on an outer surface of the noise filter, and closing a pressing portion of the wire fixing portion toward the pressing surface so that the wire is held between the pressing surface and the pressing portion.

Preferably, the inserting of the wire into the wire insertion through-hole and looping of the wire include providing the noise filter separable into at least two portions, and separating the noise filter into the at least the two portions. At least one of the separated portions has at least a portion of the wire insertion through-hole. The inserting further includes winding of the wire at least once around one of the separated portions of the noise filter so that the wire is aligned in the direction of the wire insertion through-hole, and closing the at least two portions together to form a single unit.

Thus, the operation for mounting a noise filter on a wire can be achieved by simply and easily.

BRIEF DESCRIPTION OF THE DRAWINGS

The present invention is further described in the detailed description which follows, with reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

Figure 1A:
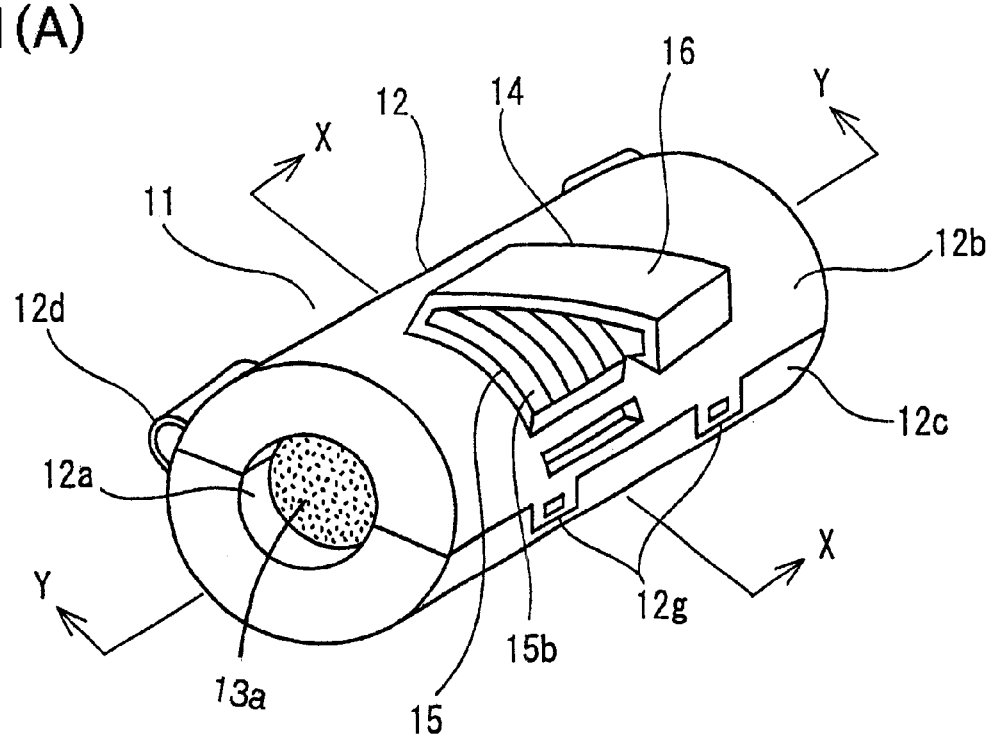
FIG. 1(A) is a perspective view illustrating a noise filter according to a first embodiment of the present invention.

Embodiments of the present invention are explained in the following with reference to figures.

FIGS. 1(A)–4(B) show a noise filter 11 according to a first embodiment of the present invention. The noise filter 11 has a case 12 and a ferrite core 13 that is provided inside of the case 12. The ferrite core 13 includes a pair of core members 13b and 13c, each of which forms a semi-cylinder with a wire insertion through-hole 13a extending in an axial direction at the center of the cylinder. The ferrite core 13 forms a cylinder as a whole, by combining the pair of core members 13b and 13c.

Figure 1B:
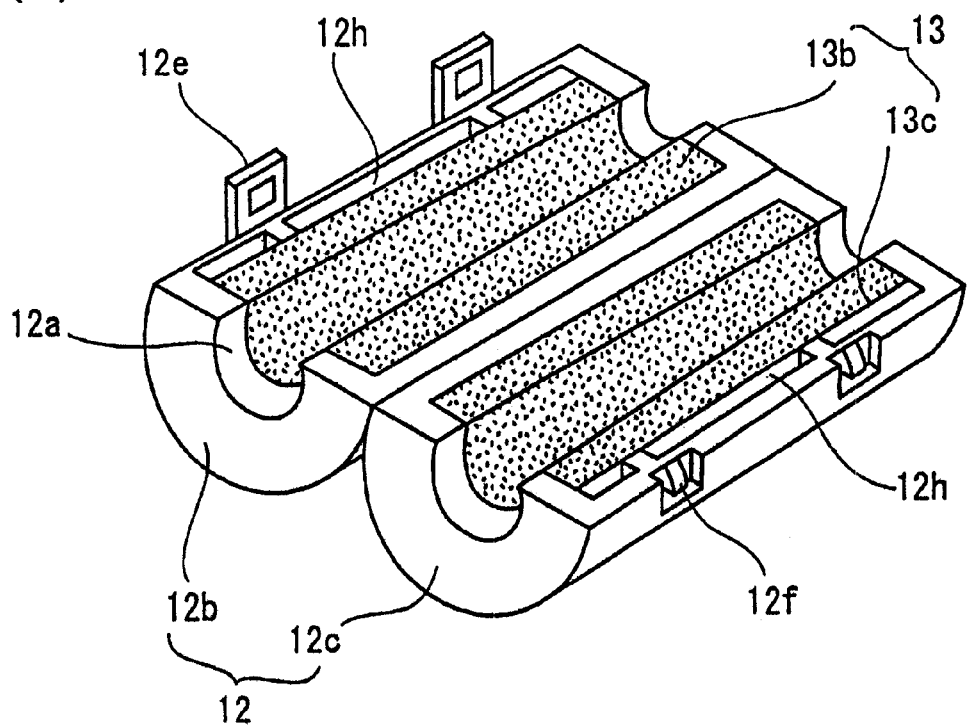
FIG. 1(B) is a perspective view of the noise filter shown in FIG. 1(A), showing the case in an opened position.

Similar to the ferrite core 13, the case 12 includes, as shown in FIG. 1(B), a pair of case portions 12b and 12c, each of which forms a semi-cylinder. Each of the case portions 12b and 12c has through-holes 12a at the center of the opposite ends. The pair of case portions 12b and 12c are connected at edges along an axial direction of the semi-cylinder by using, for example, a pair of hinges 12d so as to be openable and closable with respect to each other. The other edges of the case portions 12b and 12c, which are opposite to the edges at which the hinges 12d are provided, has a locking mechanism 12g, for example, including a locking frame 12e on one case portion and a hook portion 12f on the other case portion. Further, the case portions 12b and 12c have respective recessed portions 12h in the interior, and the ferrite cores 13b and 13c are mounted into the recessed portions 12h.

Figure 2A:
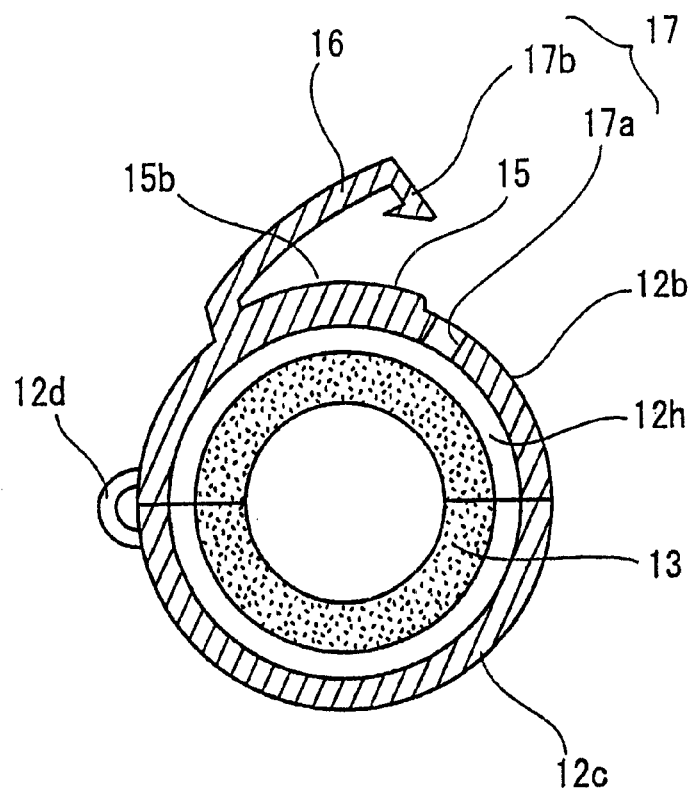
FIGS. 2(A) and 2(B), respectively, are a cross-sectional view of the noise filter shown in FIG. 1(A) viewed in the direction of the line X—X, and a partial cross-sectional view of the noise filter shown in FIG. 1(A) viewed in the direction of the line Y—Y.
Figure 2B:
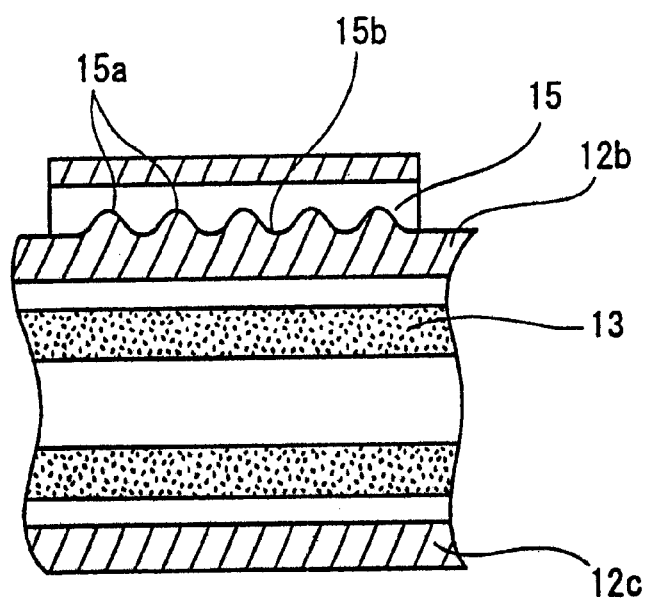

A wire fixing portion 14 is provided on the outer peripheral surface of the case portion 12b to hold and fix a portion of the wires W looped around the outside of the case 12. In this embodiment, the wire fixing portion 14 includes a pressing surface 15 and a pressing portion 16. The pressing surface 15 is provided on the outer peripheral surface at about the center of the length of the cylindrical case portion 12b, as shown in FIG. 1(A). The pressing portion 16 faces the pressing surface 15, and can be opened from and closed against the pressing surface 15. The pressing surface 15 includes a stopper 15b having a plurality of protruding strips 15a aligned in parallel in a direction generally perpendicular to the longitudinal direction of the looped wires W. Thus, the stopper 15b forms ridges and troughs on the pressing surface 15, as shown in FIG. 2(B). One edge of the pressing portion 16 is pivotally mounted to the case portion 12b at an edge of the pressing surface 15 by using, for example, a hinge 16a disposed parallel to the longitudinal direction of the looped wires W. Thus, the pressing portion 16 can be opened from and closed toward the pressing surface 15 around the hinge 16a so as to cross the looped wires W outside of the case 12. Further, at the other edge of the wire fixing portion 14, which is opposite the edge having the hinge 16a, a locking portion 17 is provided, for example, by a locking hole 17a and a locking hook 17b. The locking hole 17a is formed on the case portion 12b at a position adjacent the pressing surface 15 and opposite from the hinge 16a. The locking hook 17b extends from the edge of the pressing portion 16 which is opposite the hinge 16a. Due to the locking portion 17, the pressing portion 16 is locked in a condition such that the pressing portion 16 is closed toward the pressing surface 15.

Figure 3A:
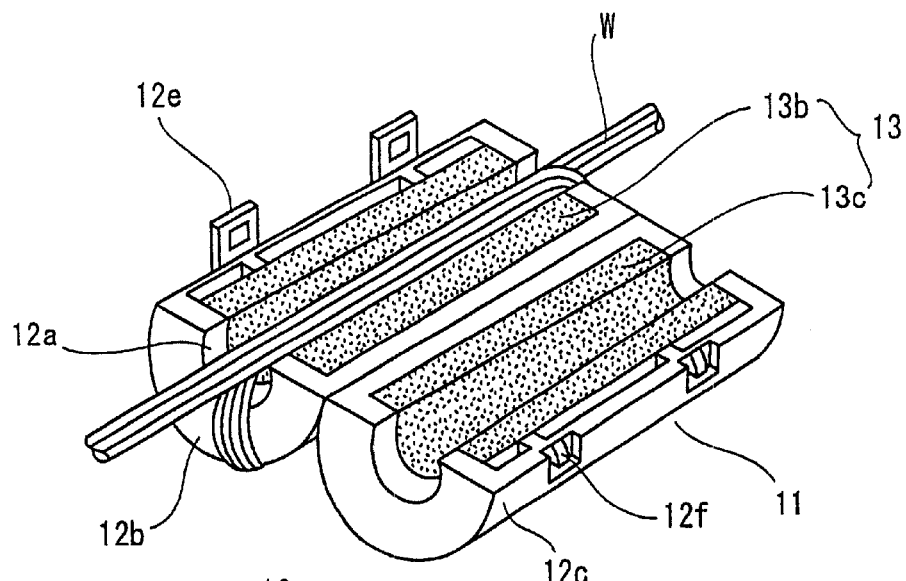
FIGS. 3(A)–3(C) are-perspective views illustrating a mounting operation of the noise filter on wires.

When the noise filter 11 as constructed above is mounted at a predetermined position of the wires W, first, as shown in FIGS. 3(A), the wires W are looped to wind around the case portion 12b of the opened case 12, along the wire insertion through-hole 13a of the core member 13b. The wires can be looped to wind around either of the case portion 12b or 12c; however, it is preferable to use the case portion 12b that has the wire fixing portion 17 thereon so that the looped wire can be placed on the pressing surface 15, when winding.

Figure 3B:
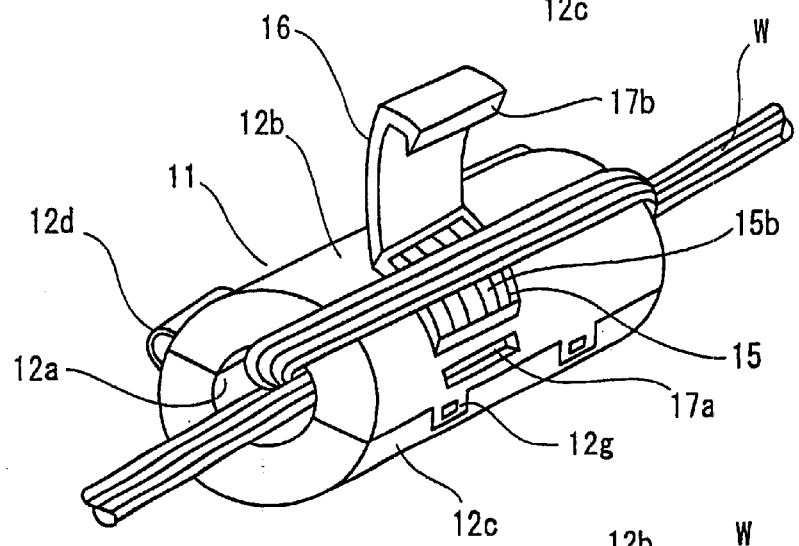

Next, the case portions 12b and 12c are closed together. As shown in FIG. 3(B), the wires W once passed through the wire insertion through-hole 13a are looped to wind around the outside of the case portion 12b and passes back through the wire insertion through-hole 13a. Further, the wires W cross on the pressing surface 15 on the outer peripheral surface of the case portion 12b.

Figure 3C:
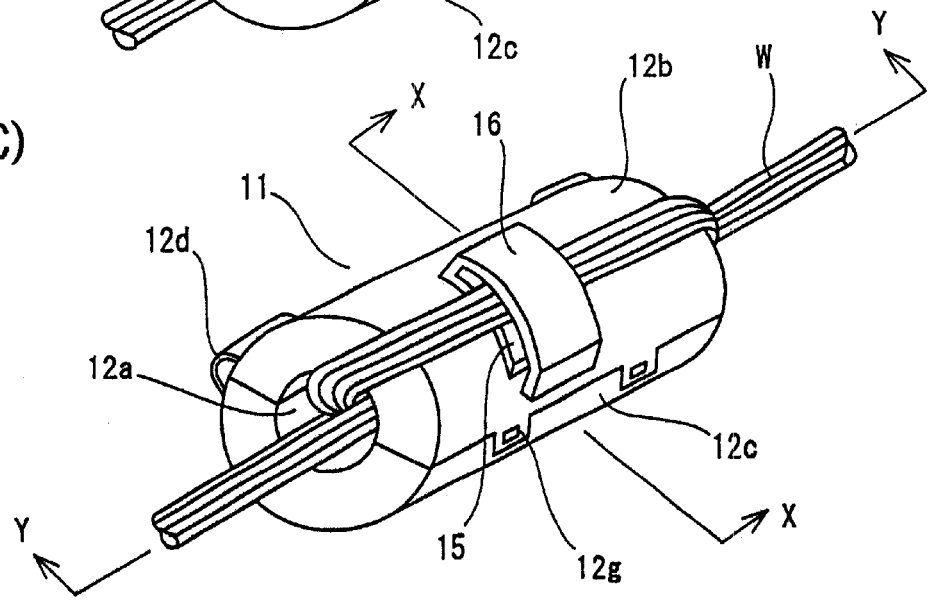
Figure 4A:
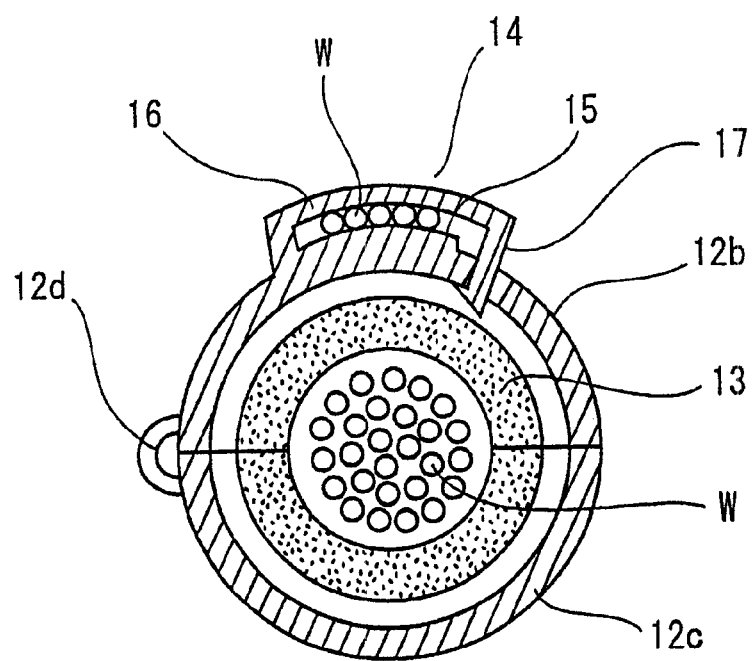
FIGS. 4(A) and 4(B), respectively, are a cross-sectional view of the noise filter shown in FIG. 3(C) viewed in the direction of the line X—X, and a partial cross-sectional view of the noise filter shown in FIG. 3(C) viewed in the direction of the line Y—Y.
Figure 4B:
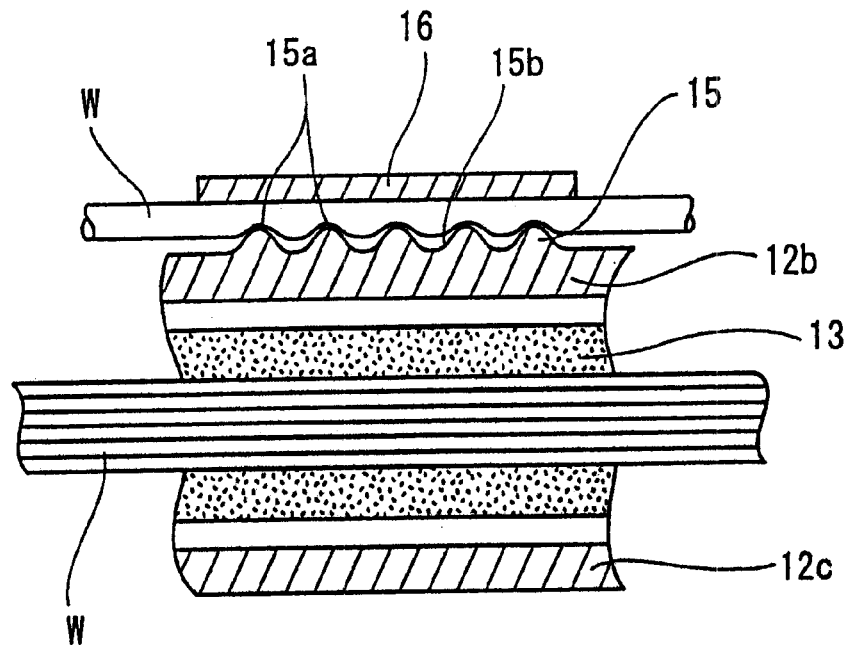

Next, as shown in FIG. 3(C), the pressing portion 16 is moved to be closed toward the pressing surface 15 so that the wires W are sandwiched between the pressing surface 15 and the pressing portion 16. Further, the pressing portion 16 is pressed toward pressing surface 15 so as to hold the wires W down, and the locking hook 17b extending from the edge of the pressing portion 16 is locked into the locking hole 17a (FIG. 4(A)). As shown in FIG. 4(A), the wires W are aligned side by side, without overlapping, between the pressing surface 15 and the pressing portion 16. Further, as shown in FIG. 4(B), due to the stopper 15b forming ridges and troughs on the pressing surface 15, the wires W are partially pressed into the pressing portion 15. Thus, a sufficient force can be applied that resists a tension force along the longitudinal direction of the wires W. Thus, as described above, the noise filter 11 mounted on the wires W is positively prevented from displacement or sliding on the wires W, by simply closing the pressing portion 16 toward the pressing surface 15 after the wires W are looped to wind around the case 12.

Figure 5:
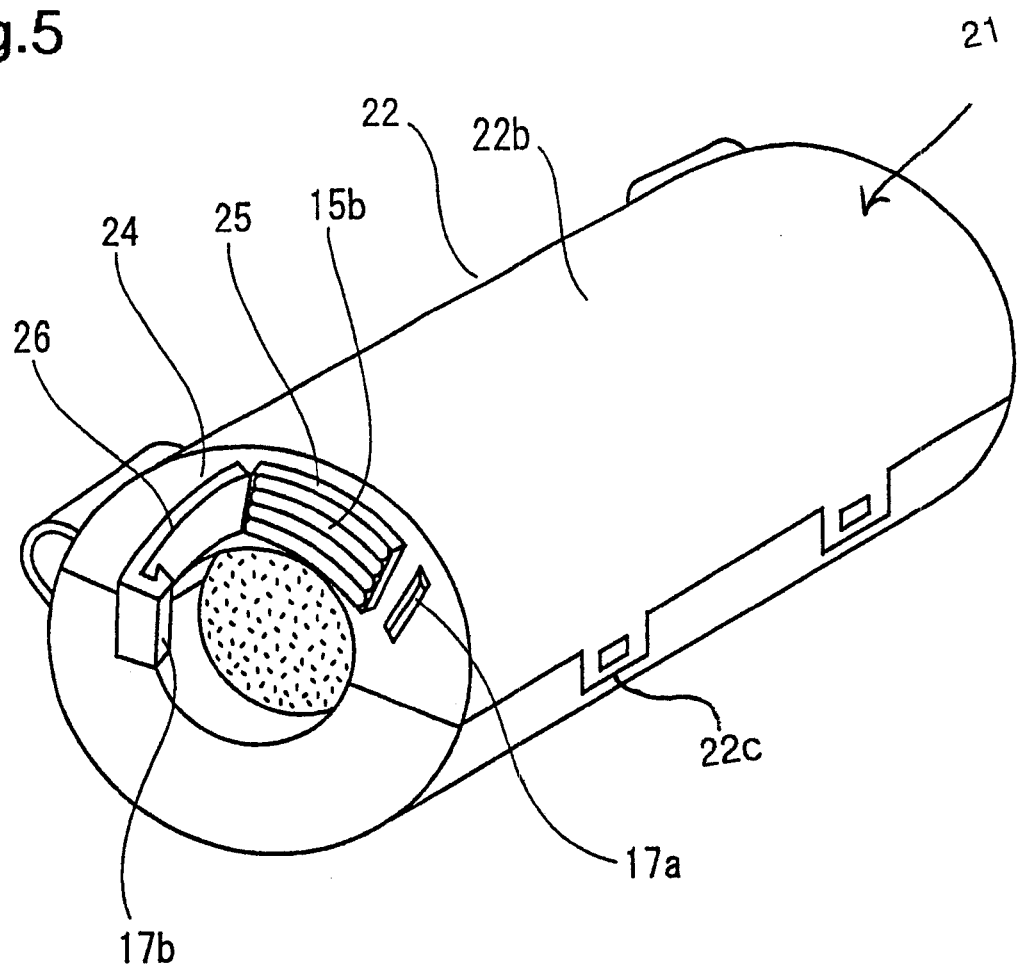
FIG. 5 is a perspective view illustrating a noise filter according to a second embodiment of the present invention.

FIG. 5 shows a noise filter 21 according to a second embodiment of the present invention. In this embodiment, a wire fixing portion 24, including a pressing surface 25 and a pressing portion 26, is provided on at least one end surface of the case portion 22b of a case 22, instead of the outer peripheral surface of the case portion 22b. According to the second embodiment, since the pressing portion 26 is not provided on the outer peripheral surface of the case portion 22b, the pressing portion 26 does not become an obstacle and is prevented from unintentional damage, or from being separated from the case portion 22b by an interference with other parts. Since the construction of the noise filter 21, other than the position of the wire fixing portion 24, of the second embodiment is the same as that in the first embodiment, the detailed description of the noise filter is omitted.

In the above-described embodiments, the ferrite core 13 is formed as a pair of semi-cylinders 13b and 13c. However, a single unitary cylinder can be used instead of the pair of semi-cylinders. Further, in the above-described embodiments, the wire fixing portion 14 or 24 is provided on a single case portion 12b or 22b. However, the wire fixing portion 14 or 24 can be provided on either or both of the case portions 12b and 12c, or 22b and 22c. As described above, the wire fixing portion can be provided at any position on the outer surface of the case, either on the outer peripheral surface or on the end surface. Further, it is possible to provide more than one wire fixing portion, for example, one on the peripheral surface, and another on the end surface.

Further, in the above-described embodiments, the wire insertion through-hole is provided in both of the semi-cylinders 13b and 13c of the ferrite cores. However, it is possible to provide the insertion through-hole in only one of the semi-cylinders. The wire fixing portion is preferably provided on the semi-cylinder which has the wire insertion through-hole to improve the simplicity of the mounting operation of the noise filter. In that case, when the noise filter is mounted on the wires, the wire is looped to wind around the semi-cylinder that has the insertion through-hole, along the insertion hole 13a.

Figure 6A:
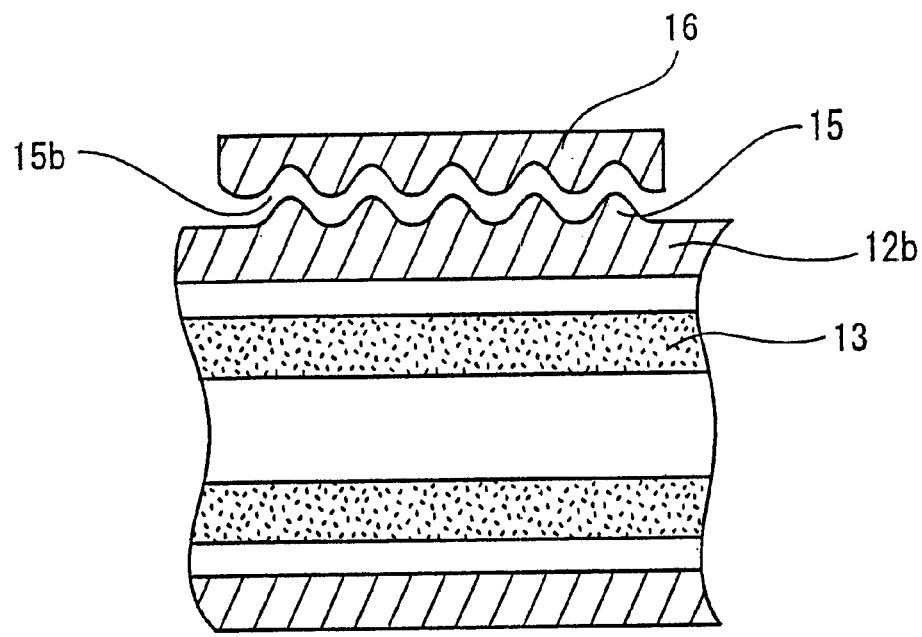
FIGS. 6(A)–6(C), respectively, are modifications of a wire fixing portion according to the present invention.
Figure 6B:
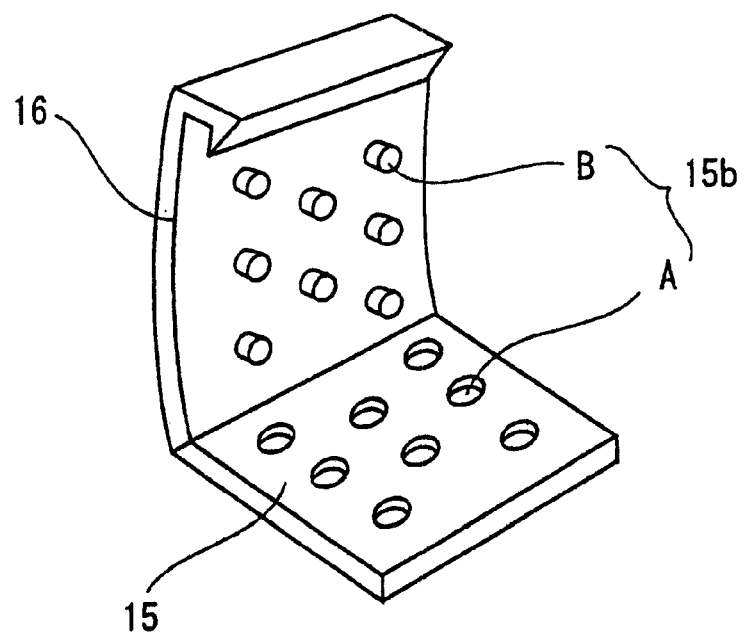

Furthermore, the stopper 15b of the wire fixing portion 14 may be formed on the pressing surface 15 or 25 as in the above-described embodiments. Alternatively, the stopper can also be formed on the pressing portion 16 or 26, or, as shown in FIG. 6(A), can be formed on both facing surfaces of the pressing surface 15 (or 25) and the pressing portion 16 (or 26). Further, as shown in the modified embodiment in FIG. 6(B), the stopper 15b can be formed as holes (or depressions) A provided in the pressing surface 15 (or in the pressing portion 16) and protruding portions (or projections) B facing the holes A. In this case, portions of the wires W are pressed into the holes A by the protruding portions B.

In addition, the core member can be made of any material that absorbs electromagnetic noise, such as on an iron alloy. Further, the core member or the case can be formed as a shape other than a cylinder.

Figure 6C:
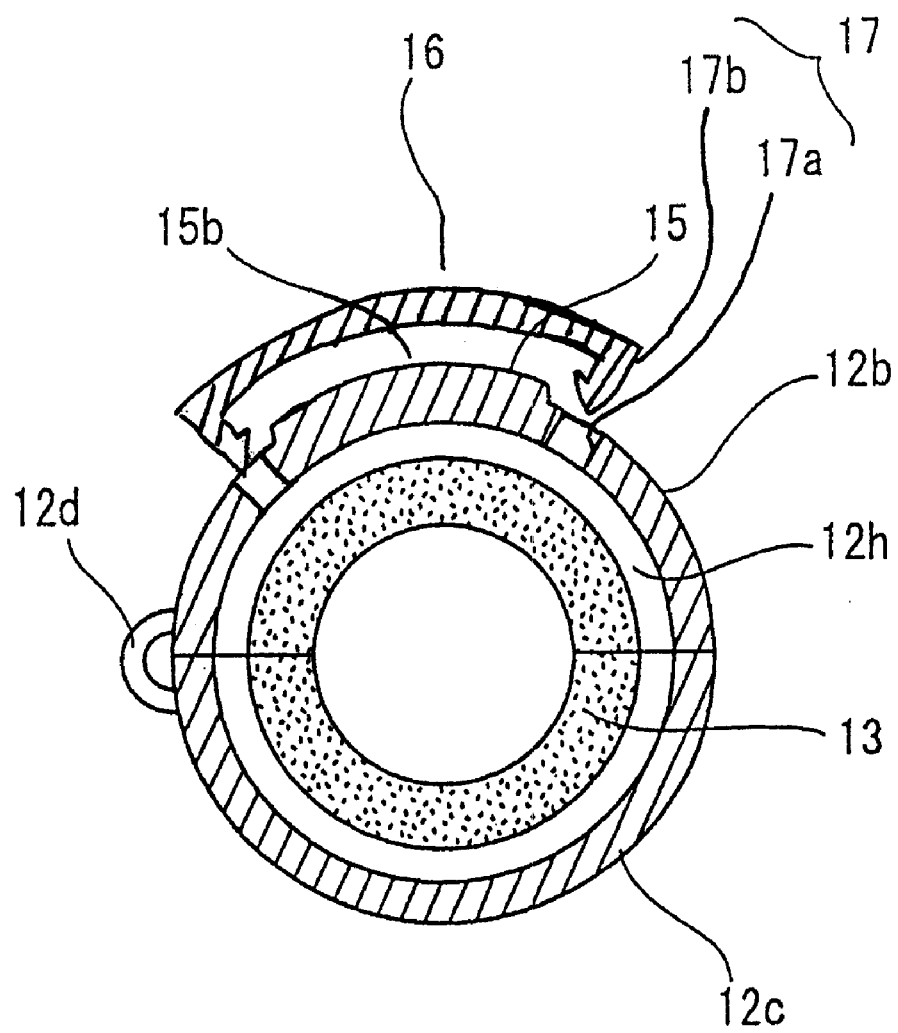
Figure 7:
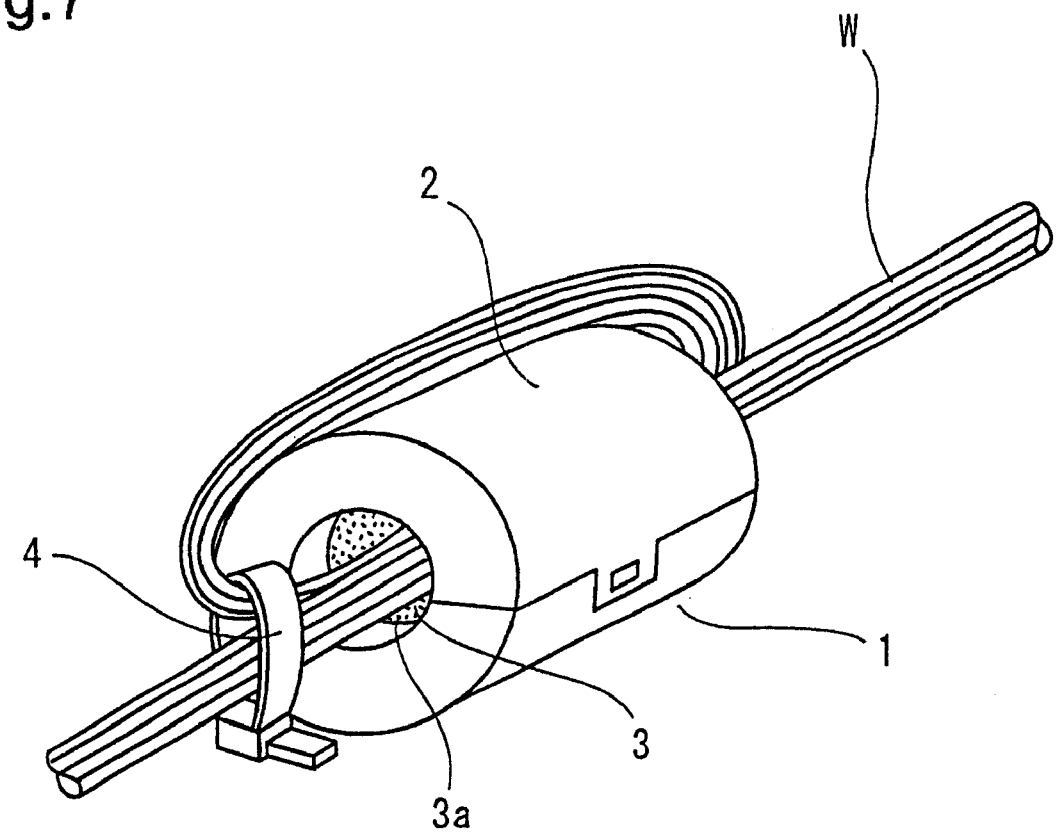
FIG. 7 is a perspective view illustrating a conventional noise filter.

Also, the locking portion 17 can be formed as any suitable interengaging locking elements. For example, the locking hook 17b could be formed on the case 12 to engage with a hole in the pressing portion or with an outer edge of the pressing portion. Additionally, instead of the pressing portion being hingedly connected at one edge, the pressing portion may be formed as a separate member that is connected to the case by a plurality of interengaging latching members. In this regard, one example would be to replace the hinge portion of the pressing portion 16 of FIGS. 1(A) and 2(A) with a second locking hook 17b and provide the case with a second locking hole 17a on the hinge side. Thus, as shown in FIG. 6(C), the pressing portion 17a would be provided as a separate member to be snapped into position by interengaging the latching members (locking hooks) 17b to hold the wires in fixed position.

As clearly described above, according to the noise filter of the present invention, a noise filter mounted at a predetermined position on wires is prevented from displacement or sliding on the wires, and thus, can be securely fixed on the wires. Further, the fixing operation becomes an easy operation in which a pressing portion is closed toward the case of the noise filter and is locked with the locking portion. Accordingly, the efficiency of the mounting operation of the noise filter is improved, and the quality of products having the noise filter can be improved.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The present disclosure relates to subject matter contained in priority Japanese Application No. HEI 11-344550, filed on Dec. 3, 1999, which is herein expressly incorporated by reference in its entirety.

What is claimed is:

1. A noise filter comprising:
    a core having a wire insertion through-hole extending in a longitudinal direction of the core, the core being configured to absorb an electromagnetic noise;
    a case that covers the core; and
    a wire fixing portion positioned on an outer circumferential surface of the case so as to hold a wire passing through the wire insertion through-hole and looped to wind around an outside of the case;
    wherein the wire fixing portion comprises a pressing surface provided on the outer circumferential surface of the case, and a pressing portion that faces the pressing surface and can be opened from and closed toward the pressing surface, such that the wire is held between the pressing surface and the pressing portion on the outer circumferential surface of the case.

2. The noise filter according to claim 1, wherein the wire fixing portion further comprises a stopper including at least one depression formed in one of the pressing surface and a surface of the pressing portion facing the pressing surface, and at least one projection formed on another one of the pressing surface and the surface of the pressing portion facing the pressing surface.

3. The noise filter according to claim 1, wherein the wire fixing portion further comprises a stopper including at least one ridge and at least one trough formed on at least one of the pressing surface and a surface of the pressing portion facing the pressing surface.

4. The noise filter according to claim 1, wherein the wire fixing portion further comprises interengaging locking elements respectively provided on the pressing portion and on the case, the interengaging locking elements cooperating to lock the pressing portion to the outer surface of the case to hold the wire in position.

5. The noise filter according to claim 4, wherein the interengaging locking elements respectively comprise a locking hook and a locking hole, the interengaging locking elements locking the pressing portion to the outer surface of the case by inserting the locking hook into the locking hole.

6. The noise filter according to claim 4, wherein the wire fixing portion further comprises a hinge connecting an edge of the pressing surface and an edge of the pressing portion along an longitudinal direction of the core, and wherein the interengaging locking elements are provided at an edge opposite the edge where the hinge is placed.

7. The noise filter according to claim 4, wherein the pressing portion is formed separately from the case, and a plurality of interengaging locking elements are respectively provided on the pressing portion and on the case to retain the pressing portion in position to hold the wire.

8. The noise filter according to claim 1, wherein the case is formed to have a generally cylindrical shape and the wire fixing portion is provided on an outer peripheral surface of the case.

9. The noise filter according to claim 1, wherein the noise filter is provided in at least two separable portions, and at least one of the separable portions has at least a portion of the wire insertion through-hole.

10. The noise filter according to claim 9, wherein the wire fixing portion is provided on one of the separable portions in which the portion of the wire insertion through-hole is provided.

11. In combination with a wire, a noise filter comprising:
a core having a wire insertion through-hole extending in a longitudinal direction of the core, the core being configured to absorb an electromagnetic noise;
a case that covers the core; and
a wire fixing portion positioned on an outer circumferential surface of the case so as to hold the wire which passes through the wire insertion through-hole and is looped to wind around an outside of the case;
wherein the wire fixing portion comprises a pressing surface provided on the outer circumferential surface of the case, and a pressing portion that faces the pressing surface and can be opened from and closed toward the pressing surface, such that the wire is held between the pressing surface and the pressing portion on the outer circumferential surface of the case.

12. The combination of the wire and the noise filter according to claim 11, wherein the wire comprises a plurality of wires and the plurality of wires are aligned side by side without overlapping between the pressing portion and the pressing surface.

13. A method of mounting a noise filter, including a core configured to absorb an electromagnetic noise and a case covering the core, on a wire, comprising:

inserting the wire into a wire insertion through-hole extending in a longitudinal direction of the noise filter and looping the wire, so that the wire winds around the noise filter;
placing the wire on an exterior of the noise filter on a pressing surface of a wire fixing portion provided on an outer circumferential surface of the case; and
closing a pressing portion of the wire fixing portion toward the pressing surface so that the wire is held between the pressing surface and the pressing portion on the outer circumferential surface of the case.

14. The method according to claim 13, wherein the inserting comprises:
providing the noise filter separable into at least two portions;
separating the noise filter into the at least two portions, at least one of the separated portions having at least a portion of the wire insertion through-hole;
winding the wire at least once around one of the portions of the noise filter so that the wire is aligned in the direction of the wire insertion through-hole; and
closing the portions together to form a single unit.

15. A noise filter comprising:
a core having a wire insertion through-hole extending in a longitudinal direction of the core, the core being configured to absorb an electromagnetic noise;
a case that covers the core; and
a wire fixing portion positioned on an outer surface of the case so as to hold a wire passing through the wire insertion through-hole and looped to wind around an outside of the case;
wherein the wire fixing portion comprises a pressing surface provided on the outer surface of the case, a pressing portion that faces the pressing surface and can be opened from and closed toward the pressing surface, such that the wire is held between the pressing surface and the pressing portion, and interengaging locking elements respectively provided on the pressing portion and on the case, the interengaging locking elements cooperating to lock the pressing portion to the outer surface of the case to hold the wire in position.

16. The noise filter according to claim 15, wherein the interengaging locking elements respectively comprise a locking hook and a locking hole, the interengaging locking elements locking the pressing portion to the outer surface of the case by inserting the locking hook into the locking hole.

17. The noise filter according to claim 15, wherein the wire fixing portion further comprises a hinge connecting an edge of the pressing surface and an edge of the pressing portion along an longitudinal direction of the core, and wherein the interengaging locking elements are provided at an edge opposite the edge where the hinge is placed.

18. The noise filter according to claim 15, wherein the pressing portion is formed separately from the case.

* * * * *